US012653060B2

(12) United States Patent
Sugimoto et al.

(10) Patent No.: US 12,653,060 B2
(45) Date of Patent: Jun. 9, 2026

(54) RESIN COMPOSITION FOR ENCAPSULATING LIGHT-EMITTING DEVICE, LIGHT SOURCE UNIT, AND METHOD FOR MANUFACTURING LIGHT SOURCE UNIT

(71) Applicant: NITTO DENKO CORPORATION, Ibaraki (JP)

(72) Inventors: Naoya Sugimoto, Osaka (JP); Shoichi Kawamitsu, Osaka (JP)

(73) Assignee: NITTO DENKO CORPORATION, Ibaraki (JP)

( * ) Notice: Subject to any disclaimer, the term of this patent is extended or adjusted under 35 U.S.C. 154(b) by 979 days.

(21) Appl. No.: 17/630,640

(22) PCT Filed: Jul. 31, 2020

(86) PCT No.: PCT/JP2020/029453
§ 371 (c)(1),
(2) Date: Jan. 27, 2022

(87) PCT Pub. No.: WO2021/020565
PCT Pub. Date: Feb. 4, 2021

(65) Prior Publication Data
US 2022/0262692 A1 Aug. 18, 2022

(30) Foreign Application Priority Data
Jul. 31, 2019 (JP) ................................ 2019-141644

(51) Int. Cl.
*H01L 23/28* (2006.01)
*C08F 222/04* (2006.01)
(Continued)

(52) U.S. Cl.
CPC .......... *H10W 74/00* (2026.01); *C08F 222/04* (2013.01); *C08L 37/00* (2013.01); *C09K 8/516* (2013.01)

(58) Field of Classification Search
None
See application file for complete search history.

(56) References Cited

U.S. PATENT DOCUMENTS 3,308,107 A 3/1967 Stanley et al.
4,281,092 A 7/1981 Breazeale
(Continued)

FOREIGN PATENT DOCUMENTS

CN 103269853 A 8/2013
CN 107502280 A * 12/2017
(Continued)

OTHER PUBLICATIONS

Notice of Reasons for Revocation dated Nov. 18, 2024, issued in counterpart JP Patent No. 7432776 B with English translation. (50 pages).

(Continued)

*Primary Examiner* — Tae H Yoon
(74) *Attorney, Agent, or Firm* — WHDA, LLP

(57) ABSTRACT

The present invention provides a resin composition for producing an encapsulating member having high heat resistance and high encapsulation performance. In the resin composition for encapsulating a light-emitting device according to the present invention, at least one of (i) and (ii) is satisfied:

(i) the resin composition includes a polymer (P1) including: a structural unit (A) represented by the following formula (1); and a structural unit (B) having at least one functional group selected from the group consisting of (Continued)

a carbonyl-containing group, a hydroxyl group, an epoxy group, an isocyanate group, and a cyano group; and (ii) the resin composition includes: a polymer (P2) including the structural unit (A); and a polymer (P3) including the structural unit (B).

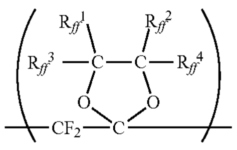

(1)

9 Claims, 1 Drawing Sheet

(51) Int. Cl.

| | |
|---|---|
| ***C08L 37/00*** | (2006.01) |
| ***C09K 8/516*** | (2006.01) |
| ***H10W 74/00*** | (2026.01) |

(56) References Cited

U.S. PATENT DOCUMENTS

| | | | |
|---|---|---|---|
| 2006/0281883 | A1 | 12/2006 | Sugiyama |
| 2007/0043187 | A1 | 2/2007 | Okamoto et al. |
| 2007/0228390 | A1 | 10/2007 | Hattori et al. |
| 2013/0247984 | A1 | 9/2013 | Kim et al. |
| 2015/0243856 | A1 | 8/2015 | Yamada et al. |
| 2017/0114253 | A1 | 4/2017 | Nakayama et al. |
| 2022/0262692 | A1 | 8/2022 | Sugimoto et al. |

FOREIGN PATENT DOCUMENTS

| | | | |
|---|---|---|---|
| GB | 1092016 | A | 11/1967 |
| JP | S43-029154 | B1 | 12/1968 |
| JP | H04-189880 | A | 7/1992 |
| JP | 2003-234008 | A | 8/2003 |
| JP | 2006-294925 | A | 10/2006 |
| JP | 2007-504125 | A | 3/2007 |
| JP | 2007-242246 | A | 9/2007 |
| JP | 2007-273562 | A | 10/2007 |
| JP | 2013-087162 | A | 5/2013 |
| JP | 5194431 | B2 | 5/2013 |
| JP | 2014-080479 | A | 5/2014 |
| JP | 2018-157085 | A | 10/2018 |
| JP | 2021-024901 | A | 2/2021 |
| JP | 7225054 | B2 | 2/2023 |
| WO | 2005/085303 | A1 | 9/2005 |
| WO | 2014/178288 | A1 | 11/2014 |
| WO | 2016/010043 | A1 | 1/2016 |

OTHER PUBLICATIONS

Office Action dated Dec. 13, 2022, issued in counterpart CN Application No. 202080054074.7, with English translation. (13 pages).

Written Opposition dated Aug. 9, 2024, issued in counterpart JP Patent No. 7432776 with English translation. (59 pages).

Written Opposition dated Aug. 16, 2024, issued in counterpart JP Patent No. 7432776 with English translation. (70 pages).

Minfeng Fang, et al., Mechanical and optical properties of the copolymers of perfluoro (2-methylene-4-methyl-1, 3-dioxolane) and chlorotrifluoroethylene, Journal of Fluorine Chemistry, 214, 2018, p. 63-67; Cited in JP Written Opposition dated Aug. 16, 2024.

International Search Report dated Oct. 20, 2020, issued in counterpart application No. PCT/JP2020/029453 (2 pages).

Written Opinion dated Oct. 20, 2020, issued in counterpart application No. PCT/JP2020/029453, w/English translation (6 pages).

Office Action dated Jun. 6, 2025, issued in counterpart TW Application No. 113139662, with English translation. (15 pages).

Written Opinion 1, issued in counterpart JP Application No. 2024-700758, with English translation. (30 pages).

Mikes, F. et al., Synthesis and Characterization of an Amorphous Perfluoropolymer: Poly(perfluoro-2-methylene-4-methyl-1,3-dioxolane), Macromolecules, vol. 38, No. 10, 2005, p. 4237-4245. (9 pages); cited in JP Written Opinion 1 dated Apr. 15, 2025.

Development of Perfluoro Transparent Resins as Advanced Electronic and Optical Materials Obtained by Radical Cyclization Polymerization, Journal of the Chemical Society of Japan, 2001, No. 12, p. 659-668, with English Abstract. (11 pages); cited in JP Written Opinion 1 dated Apr. 15, 2025.

Notice of Reasons for Revocation, issued in counterpart JP Application No. 2024-700758, with English translation. (138 pages).

Written Opinion 2, issued in counterpart JP Application No. 2024-700758, with English translation. (12 pages).

Office Action dated Dec. 18, 2025, issued in counterpart TW Application No. 113139662, with English translation. (14 pages).

Decision on Opposition dated Jan. 16, 2026, issued in counterpart JP Patent No. JP7432776B, with English translation.(190 pages).

* cited by examiner

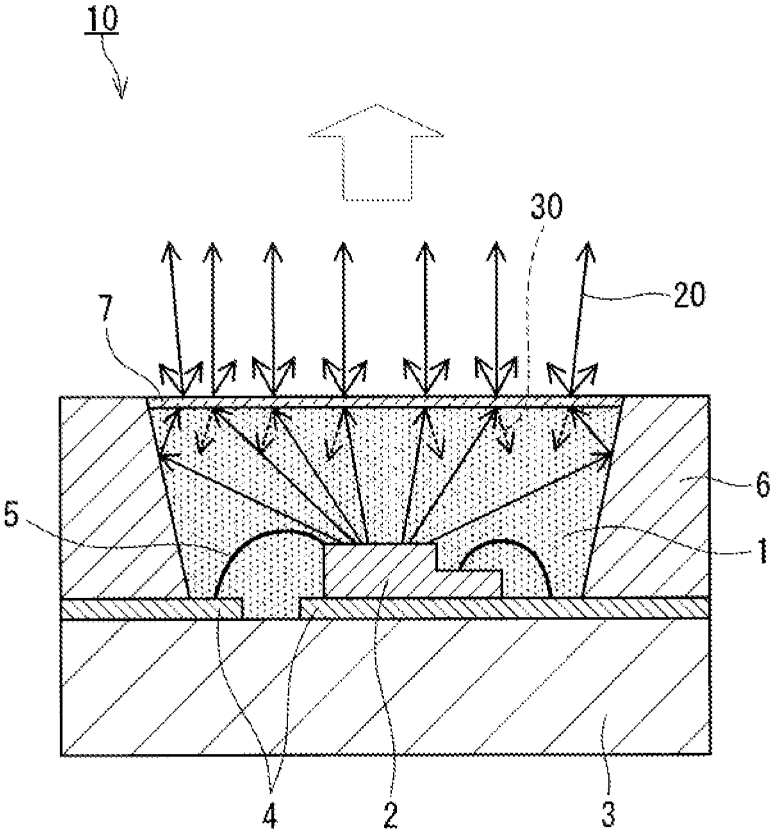
10
30
20
7
6
5
1
4
2
3

RESIN COMPOSITION FOR ENCAPSULATING LIGHT-EMITTING DEVICE, LIGHT SOURCE UNIT, AND METHOD FOR MANUFACTURING LIGHT SOURCE UNIT

CROSS-REFERENCE TO RELATED APPLICATIONS

This application is a U.S. national stage application of the PCT International Application No. PCT/JP2020/029453 filed on Jul. 31, 2020, which claims the benefit of foreign priority of Japanese patent application No. 2019-141644 filed on Jul. 31, 2019, the contents all of which are incorporated herein by reference.

TECHNICAL FIELD

The present invention relates to a resin composition for encapsulating a light-emitting device, a light source unit, and a method for manufacturing a light source unit.

BACKGROUND ART

A light-emitting device such as a light-emitting diode (LED) is used in a state where it is encapsulated in an encapsulating member. An encapsulating member is, for example, formed of a transparent resin such as an epoxy resin or a silicone resin. However, epoxy resins and silicone resins, which are degraded by short-wavelength light such as ultraviolet light, are not suitable for an encapsulating member for a light-emitting device radiating short-wavelength light, such as an ultraviolet-light-emitting device.

Fluorinated polymers, on the other hand, are less likely to be degraded by short-wavelength light and are thus used as materials of an encapsulating member for a light-emitting device. For example, Patent Literature 1 discloses perfluoro polymers, such as perfluoropolyether and a polymer including a repeating unit based on perfluoro(alkylvinyl ether), as materials of an encapsulating agent for encapsulating a light-emitting device.

CITATION LIST

Patent Literature

Patent Literature 1: JP 5194431 B2

SUMMARY OF INVENTION

Technical Problem

Because of its insufficient encapsulation performance, the encapsulating agent disclosed in Patent Literature 1 needs to be used in combination with another encapsulating member. Specifically, after a light-emitting device is encapsulated in the encapsulating agent of Patent Literature 1, the light-emitting device and the encapsulating agent need to be further encapsulated in another encapsulating member. Additional use of the other encapsulating member decreases the efficiency in producing a light source unit including the light-emitting device. Besides, the encapsulating member is required to have high heat resistance.

Therefore, the present invention aims to provide a resin composition for producing an encapsulating member having high heat resistance and high encapsulation performance.

Solution to Problem

The present invention provides a resin composition for encapsulating a light-emitting device, wherein at least one of (i) and (ii) is satisfied:

(i) the resin composition includes a polymer (P1) including: a structural unit (A) represented by the following formula (1); and a structural unit (B) having at least one functional group selected from the group consisting of a carbonyl-containing group, a hydroxyl group, an epoxy group, an isocyanate group, and a cyano group; and (ii) the resin composition includes: a polymer (P2) including the structural unit (A); and a polymer (P3) including the structural unit (B):

(1)

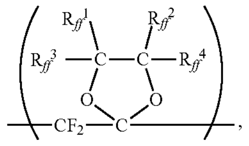

where $R_{ff}^1$ to $R_{ff}^4$ each independently represent a fluorine atom, a perfluoroalkyl group having 1 to 7 carbon atoms, or a perfluoroalkyl ether group having 1 to 7 carbon atoms, and $R_{ff}^1$ and $R_{ff}^2$ are optionally linked to form a ring.

The present invention also provides a light source unit, including:

a light-emitting device; and an encapsulating member in which the light-emitting device is encapsulated, wherein at least one of (I) and (II) is satisfied:

(I) the encapsulating member includes a polymer (P1) including: a structural unit (A) represented by the following formula (1); and a structural unit (B) having at least one functional group selected from the group consisting of a carbonyl-containing group, a hydroxyl group, an epoxy group, an isocyanate group, and a cyano group; and (II) the encapsulating member includes: a polymer (P2) including the structural unit (A); and a polymer (P3) including the structural unit (B):

(1)

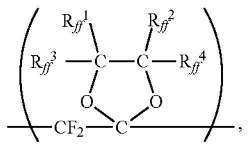

where $R_{ff}^1$ to $R_{ff}^4$ each independently represent a fluorine atom, a perfluoroalkyl group having 1 to 7 carbon atoms, or a perfluoroalkyl ether group having 1 to 7 carbon atoms, and $R_{ff}^1$ and $R_{ff}^2$ are optionally linked to form a ring.

Advantageous Effects of Invention

A resin composition for producing an encapsulating member having high heat resistance and high encapsulation performance can be provided according to the present invention.

BRIEF DESCRIPTION OF DRAWING

FIG. 1 is a cross-sectional view showing an example of a light source unit.

DESCRIPTION OF EMBODIMENTS

Hereinafter, embodiments of the present invention will be described in detail. The following description is not intended to limit the present invention to specific embodiments.

[Resin Composition for Encapsulating Light-Emitting Device]

In a resin composition for encapsulating a light-emitting device (which may hereinafter simply referred to as "resin composition") according to the present embodiment, at least one of (i) and (ii) is satisfied:

(i) the resin composition includes a polymer (P1) including: a structural unit (A) represented by the following formula (1); and a structural unit (B) having at least one functional group (F) selected from the group consisting of a carbonyl-containing group, a hydroxyl group, an epoxy group, an isocyanate group, and a cyano group; and (ii) the resin composition includes: a polymer (P2) including the structural unit (A); and a polymer (P3) including the structural unit (B).

(1)

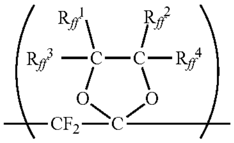

In the formula (1), $R_{ff}^1$ to $R_{ff}^4$ each independently represent a fluorine atom, a perfluoroalkyl group having 1 to 7 carbon atoms, or a perfluoroalkyl ether group having 1 to 7 carbon atoms. $R_{ff}^1$ and $R_{ff}^2$ are optionally linked to form a ring. "Perfluoro" indicates that every hydrogen atom bonded to a carbon atom is substituted by a fluorine atom. In the formula (1), the number of carbon atoms in the perfluoroalkyl group is preferably 1 to 5, more preferably 1 to 3, and even more preferably 1. The perfluoroalkyl group may be linear or branched. Examples of the perfluoroalkyl group include a trifluoromethyl group, a pentafluoroethyl group, and a heptafluoropropyl group.

In the formula (1), the number of carbon atoms in the perfluoroalkyl ether group is preferably 1 to 5 and more preferably 1 to 3. The perfluoroalkyl ether group may be linear or branched. Examples of the perfluoroalkyl ether group include a perfluoromethoxymethyl group.

When $R_{ff}^1$ and $R_{ff}^2$ are linked to form a ring, the ring may be a five-membered ring or a six-membered ring. Examples of the ring include a perfluorotetrahydrofuran ring, a perfluorocyclopentane ring, and a perfluorocyclohexane ring.

Specific examples of the structural unit (A) include structural units represented by the following formulae (A1) to (A8).

(A1)

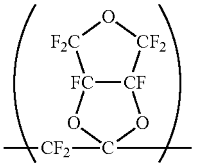

-continued (A2)

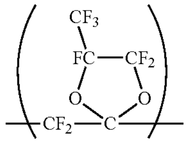

(A3)

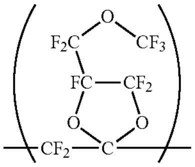

(A4)

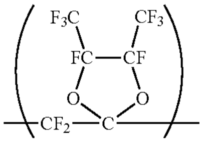

(A5)

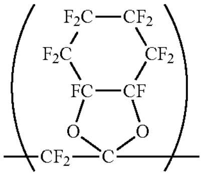

(A6)

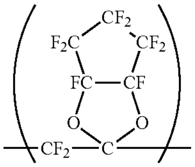

(A7)

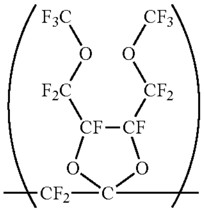

(A8)

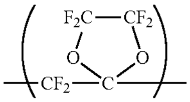

Among the structural units represented by the above formulae (A1) to (A8), the structural unit (A) is preferably the structural unit (A2), i.e., a structural unit represented by the following formula (2).

(2)

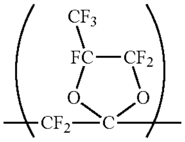

The structural unit (A) is, for example, derived from a compound represented by the following formula (3). In the formula (3), $R_{ff}^1$ to $R_{ff}^4$ are as described in the formula (1).

(3)

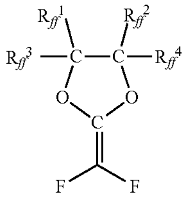

Specific examples of compound represented by the above formula (3) include compounds represented by the following formulae (M1) to (M8).

(M1)

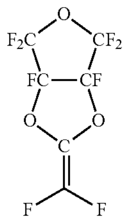

(M2)

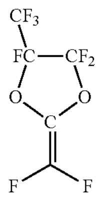

(M3)

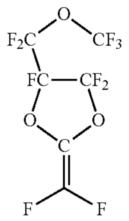

(M4)

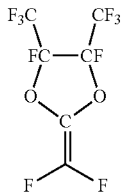

(M5)

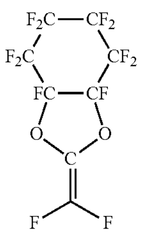

-continued (M6)

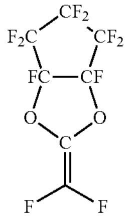

(M7)

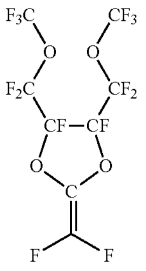

(M8)

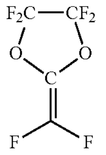

The structural unit (B) is not particularly limited as long as the structural unit (B) has the above functional group (F). The structural unit (B) is, for example, derived from a compound having a carbon-carbon double bond and the functional group (F). The structural unit (B) preferably includes no hydrogen atom, but may include a hydrogen atom. A hydrogen atom bonded to a carbon atom included in the structural unit (B) may be substituted by a fluorine atom.

Examples of the carbonyl-containing group in the functional group (F) include an acid anhydride group, a carboxy group, an acid halide group, an alkoxycarbonyl group, and a carbonate group, and the carbonyl-containing group in the functional group (F) is preferably an acid anhydride group. In terms of improving the adhesiveness of an encapsulating member formed from the resin composition, the structural unit (B) preferably has at least one selected from the group consisting of an acid anhydride group, an epoxy group, an isocyanate group, a cyano group, and more preferably has an acid anhydride group. When the structural unit (B) has a cyano group, the polymer (P1) or (P3) can form a trimer via the cyano group. A trimer of the polymer (P1) or a trimer of the polymer (P3) is suitable for improving the durability of an encapsulating member.

The structural unit (B) may have a ring structure. The ring structure of the structural unit (B) may be monocyclic or polycyclic. The number of carbon atoms in the ring structure of the structural unit (B) is, for example, 4 to 10 and preferably 4 to 6. In the structural unit (B), the ring structure may have the functional group (F) as a substituent group, or the ring structure itself may include the functional group (F). The ring structure of the structural unit (B) is preferably an acid anhydride ring. A carbon atom included in the ring structure of the structural unit (B) may form a main chain of the polymer (P1) or (P3).

Specific examples of the structural unit (B) including an acid anhydride ring include a structural unit derived from itaconic anhydride, a structural unit derived from maleic anhydride, and a structural unit derived from 5-norbornene- 2,3-dicarboxylic anhydride. That is, examples of a compound forming the structural unit (B) including an acid anhydride ring include itaconic anhydride, maleic anhydride, and 5-norbornene-2,3-dicarboxylic anhydride.

Examples of the structural unit (B) including a cyano group include a structural unit derived from a vinyl ether compound including a cyano group. The vinyl ether compound including a cyano group may be fully fluorinated. Examples of the vinyl ether compound including a cyano group include perfluoro(5-cyano-3-oxa-1-hexene), perfluoro-(7-cyano-5-methyl-3,6-dioxa-1-heptene), perfluoro-(8-cyano-5-methyl-3,6-dioxa-1-octene), perfluoro-(10-cyano-5-methyl-3,6-dioxa-1-decene), perfluoro-(11-cyano-5,8-dimethyl-3,6,9-trioxa-1-undecene), and perfluoro(8-cyano-5-methyl-3,6-dioxa-1-nonene). For example, U.S. Pat. No. 4,281,092 A describes a method for manufacturing a vinyl ether compound including a cyano group.

(Requirement (i))

The resin composition of the present embodiment preferably includes the polymer (P1). The case where the resin composition includes the polymer (P1), namely, the case where the requirement (i) is satisfied, will be described hereinafter.

The polymer (P1) may include one or more structural units (A). The polymer (P1) includes, for example, the structural unit (A) as a main component. The term "main component" herein refers to a structural unit whose content is highest in the polymer (P1) in terms of mol. The content of the structural unit (A) is, for example, 80 mol % or more, preferably 90 mol % or more, and more preferably 95 mol % or more in the polymer (P1). The upper limit of the content of the structural unit (A) is, for example, 99 mol %. The polymer (P1) may include one or more structural units (B). The content of the structural unit (B) is, for example, 20 mol % or less, preferably 10 mol % or less, and more preferably 5 mol % or less in the polymer (P1). The lower limit of the content of the structural unit (B) is, for example, 1 mol %.

The polymer (P1) may further include an additional structural unit (C) other than the structural units (A) and (B). Examples of a compound forming the additional structural unit (C) include: fluorine-containing olefin compounds such as tetrafluoroethylene and chlorotrifluoroethylene; perfluorovinyl ether compounds such as perfluoropropylvinyl ether; and cyclopolymerizable fluorine-containing compounds, such as perfluoroallyl vinyl ether and perfluorobutenylvinyl ether, having two or more polymerizable double bonds.

The method for polymerizing the polymer (P1) is not particularly limited, and, for example, a common polymerization method such as radical polymerization can be employed. A polymerization initiator for polymerization of the polymer (P1) may be a fully-fluorinated compound.

The polymer (P1) has a weight-average molecular weight of, for example, 50,000 to 1,000,000. The polymer (P1) has a glass transition temperature (Tg) of, for example, 100° C. to 140° C. The term "Tg" herein refers to a midpoint glass transition temperature ($T_{mg}$) determined according to JIS K 7121: 1987. The polymer (P1) has a 1% weight loss temperature of, for example, 220° C. or higher. The term "1% weight loss temperature" herein refers to a temperature at which the weight of the polymer (P1) becomes lower by 1% than the weight thereof obtained before measurement, the temperature being obtained by heating the polymer (P1) under an air atmosphere from room temperature (20° C.±15° C.) at a temperature increase rate of 10° C./min using a thermogravimetric analyzer (TGA).

The polymer (P1) has a viscosity of, for example, 1,000 to 10,000 mPa·s at 250° C. The viscosity of the polymer (P1) can be measured using a commercially-available cone-and-plate rotational viscometer. The higher the viscosity of the polymer (P1) is, the more likely the encapsulation performance of an encapsulating member formed from the resin composition is to be improved. The polymer (P1) is preferably solid at 25° C.

The polymer (P1) has, for example, a high ultraviolet transmittance. The term "ultraviolet light" herein refers to light with a wavelength of 200 to 400 nm and includes light in a deep-UV region (200 to 300 nm). In particular, the polymer (P1) has a high light transmittance, for example, at a wavelength of 365 nm and a wavelength of 265 nm. The polymer (P1) has a light transmittance of, for example, 90% or more, preferably 92% or more, more preferably 94% or more, and even more preferably 95% or more at a wavelength of 365 nm. The polymer (P1) has a light transmittance of, for example, 90% or more, preferably 92% or more, more preferably 94% or more, and even more preferably 95% or more at a wavelength of 265 nm. The light transmittance of the polymer (P1) can be determined by the following method. First, a measurement sample containing the polymer (P1) at a concentration of 10 weight % is prepared. The measurement sample is, for example, a mixture of the polymer (P1) and a solvent that allows the polymer (P1) to be dissolved or dispersed therein. For example, dichloropentafluoropropane (ASAHIKLIN (registered trademark) AK-225 manufactured by AGC Inc.) can be used as the solvent. Next, the measurement sample is put in a cell (e.g., a quartz cell having an optical path length of 1.0 cm), and the light transmittance of the measurement sample at a specific wavelength (e.g., 365 nm) is measured using a commercially-available ultraviolet-visible-near-infrared spectrophotometer. Subsequently, a control sample having the same composition as that of the measurement sample except for the lack of the polymer (P1) is prepared. The light transmittance of the control sample at the specific wavelength is measured by the same method as for the measurement sample. The light transmittance of the measurement sample is corrected on the basis of the light transmittance of the control sample. The resulting value can be determined as the light transmittance of the polymer (P1) at the specific wavelength.

The content of the polymer (P1) is, for example, 70 wt % or more and preferably 90 wt % or more in the resin composition. The resin composition, for example, consists essentially of the polymer (P1). When the resin composition includes a later-described solvent, the content of the polymer (P1) may be 10 wt % to 50 wt % or 20 wt % to 40 wt % in the resin composition.

The resin composition may further include an additional component other than the polymer (P1). The resin composition may or may not include a solvent. The solvent included in the resin composition preferably, for example, allows the polymer (P1) to be dissolved or dispersed therein. Examples of the solvent include: fluorine-containing compounds such as 1H-tridecafluorohexane (ASAHIKLIN (registered trademark) AC2000 manufactured by AGC Inc.), 1,1,1,2,2,3,3,4,4,5,5,6,6-tridecafluorooctane (ASAHIKLIN (registered trademark) AC6000 manufactured by AGC Inc.), 1,1,2,2-tetrafluoro-1-(2,2,2-trifluoroethoxy)ethane (ASAHIKLIN (registered trademark) AE3000 manufactured by AGC Inc.), dichloropentafluoropropane (ASAHIKLIN (registered trademark) AK-225 manufactured by AGC Inc.), 1,1,1,2,3,4,4,5,5,5-decafluoro-3-methoxy-2-(trifluoromethyl)pentane (CYTOP (registered trademark)

CT-SOLV100E manufactured by AGC Inc.), 1-methoxynonafluorobutane (Novec (registered trademark) 7100 manufactured by 3M Japan Limited), 1-ethoxynonafluorobutane (Novec (registered trademark) 7200 manufactured by 3M Japan Limited), perfluorohexylmethyl ether (Novec (registered trademark) 7300 manufactured by 3M Japan Limited), 1,1,1,2,3,3-hexafluoro-4-(1,1,2,3,3,3-hexafluoropropoxy) pentane (Novec (registered trademark) 7600 manufactured by 3M Japan Limited), 2H,3H-perfluoropentane (Vertrel (registered trademark) XF manufactured by Chemours-Mitsui Fluorochemical Co., Ltd.), 3,3,4,4,5,5,6,6,7,7,8,8,8-tridecafluoro-1-octanol, 4,4,5,5,6,6,7,7,8,8,9,9,9-tridecafluoro-1-nonanol, hexafluorobenzene, hexafluoro-2-propanol, 2,2,3,3,4,4,5,5-octafluoro-1-pentanol, 1H,1H,7H-dodecafluoro-1-heptanol; and other commercially-available fluorinated solvents (e.g., Fluorinert (registered trademark) FC-770 manufactured by 3M Japan Limited and CELEFIN (registered trademark) 1233Z manufactured by Central Glass Co., Ltd.). The resin composition may include one or more of these solvents. The solvent is preferably hexafluorobenzene, perfluorohexylmethyl ether, and 2H,3H-perfluoropentane in terms of solubility of the components included in the resin composition.

(Requirement (ii))

Next, the case where the resin composition includes the polymer (P2) and the polymer (P3), namely, the case where requirement (ii) is satisfied, will be described. Specifically, the polymer (P2) includes the structural unit (A) and does not include the structural unit (B). The polymer (P2) may include one or more structural units (A). The content of the structural unit (A) is, for example, 80 mol % or more, preferably 90 mol % or more, and more preferably 95 mol % or more in the polymer (P2). The polymer (P2), for example, consists essentially of the structural unit (A).

The polymer (P2) may further include the additional structural unit (C) other than the structural units (A) and (B). Examples of the compound forming the additional structural unit (C) include those described above for the polymer (P1).

The method for polymerizing the polymer (P2) is not particularly limited, and, for example, a common polymerization method such as radical polymerization can be employed. A polymerization initiator for polymerization of the polymer (P2) may be a fully-fluorinated compound.

The polymer (P2) has a weight-average molecular weight of, for example, 50,000 to 1,000,000. The polymer (P2) has a glass transition temperature (Tg) of, for example, 80° C. to 160° C.

The polymer (P2) has a viscosity of, for example, 1,000 to 10,000 mPa·s at 250° C. The viscosity of the polymer (P2) can be measured by the same method as for the polymer (P1). The polymer (P2) is preferably solid at 25° C.

The content of the polymer (P2) is, for example, 5 wt % or more and preferably 10 wt % or more in the resin composition. The upper limit of the content of the polymer (P2) is, for example, 30 wt % in the resin composition.

Specifically, the polymer (P3) includes the structural unit (B) and does not include the structural unit (A). The polymer (P3) may include one or more structural units (B). The content of the structural unit (B) is, for example, 20 mol % or less, preferably 10 mol % or less, and more preferably 5 mol % or less in the polymer (P3). The lower limit of the content of the structural unit (B) is, for example, 1 mol %.

The polymer (P3) may further include the additional structural unit (C) other than the structural units (A) and (B). Examples of the compound forming the additional structural unit (C) include those described above for the polymer (P1).

The method for polymerizing the polymer (P3) is not particularly limited, and, for example, a common polymerization method such as radical polymerization can be employed. A polymerization initiator for polymerization of the polymer (P3) may be a fully-fluorinated compound.

The polymer (P3) has a weight-average molecular weight of, for example, 50,000 to 1,000,000. The polymer (P3) has a glass transition temperature (Tg) of, for example, 80° C. to 160° C.

The polymer (P3) has a viscosity of, for example, 1,000 to 10,000 mPa·s at 250° C. The viscosity of the polymer (P3) can be measured by the same method as for the polymer (P1). The polymer (P3) is preferably solid at 25° C.

The polymer (P3) has, for example high ultraviolet transmittance. The polymer (P3) has a light transmittance of, for example, 90% or more, preferably 92% or more, more preferably 94% or more, and even more preferably 95% or more at a wavelength of 365 nm. The light transmittance of the polymer (P3) at a wavelength of 365 nm can be determined, for example, by the same method as for the polymer (P1).

The content of the polymer (P3) is, for example, 20 wt % or more and preferably 50 wt % or more in the resin composition. The upper limit of the content of the polymer (P3) is, for example, 90 wt % in the resin composition.

The resin composition may further include an additional component other than the polymer (P2) and the polymer (P3). The resin composition may or may not include a solvent. Examples of the solvent include those described above for the requirement (i).

(Properties of Resin Composition)

The resin composition has a viscosity of, for example, 1,000 to 10,000 mPa·s at 250° C. The viscosity of the resin composition can be measured by the same method as for the polymer (P1). The resin composition may be solid at 25° C.

The resin composition has, for example high ultraviolet transmittance. The resin composition has a light transmittance of, for example, 90% or more, preferably 92% or more, more preferably 94% or more, and even more preferably 95% or more at a wavelength of 365 nm. The resin composition has a light transmittance of, for example, 90% or more, preferably 92% or more, more preferably 94% or more, and even more preferably 95% or more at a wavelength of 265 nm. The light transmittance of the resin composition can be determined, for example, by the same method as for the polymer (P1). When the resin composition include the solvent, the light transmittance of the resin composition may be measured for the resin composition put in a cell.

Since at least one of the requirement (i) and the requirement (ii) is satisfied in the resin composition, an encapsulating member formed from the resin composition has high heat resistance and high encapsulation performance. In particular, the structural unit (A) is suitable for improving the heat resistance and encapsulation performance of an encapsulating member. As far as the present inventors know, there is no precedent for employment of a resin composition including the polymer (P1) or (P2) including the structural unit (A) for an encapsulating member of a light-emitting device. Moreover, because the polymer (P1) or (P2) including the structural unit (A) is not likely to be degraded by short-wavelength light, the resin composition including the polymer (P1) or (P2) is suitable for the material of an encapsulating member for an ultraviolet-light-emitting device. In other words, the resin composition of the present embodiment can be used as a resin composition for encapsulating an ultraviolet-light-emitting device. The term "ultraviolet-light-emitting device" refers to a light-emitting device radiating light with a wavelength of 200 to 400 nm, particularly 365 nm or 265 nm.

[Light Source Unit]

As shown in FIG. 1, a light source unit 10 of the present embodiment includes a light-emitting device 2 and an encapsulating member 1. The light-emitting device 2 is encapsulated in the encapsulating member 1. In the light source unit 10, at least one of (I) and (II) is satisfied: (I) the encapsulating member 1 includes the polymer (P1); and (II) the encapsulating member 1 includes the polymer (P2) and the polymer (P3). In the encapsulating member 1, the polymer (P1), the polymer (P2), and the polymer (P3) are the same as those described above for the resin composition.

The shape of the encapsulating member 1 is, for example, but not particularly limited to, the shape of a hemisphere, a circular column, a polygonal column, a circular truncated cone, or a truncated pyramid. The encapsulating member 1 may be in a gel state but is preferably in a solid state.

When the requirement (1) is satisfied, the content of the polymer (P1) is, for example, 70 wt % or more and preferably 90 wt % or more in the encapsulating member 1. The encapsulating member 1, for example, consists essentially of the polymer (P1).

When the requirement (II) is satisfied, the content of the polymer (P2) is, for example, 5 wt % or more and preferably 10 wt % or more in the encapsulating member 1. The upper limit of the content of the polymer (P2) is, for example, 30 wt % in the encapsulating member 1. The content of the polymer (P3) is, for example, 20 wt % or more and preferably 50 wt % or more in the encapsulating member 1. The upper limit of the content of the polymer (P3) is, for example, 90 wt % in the encapsulating member 1.

The light-emitting device 2 is not particularly limited, and is typically a semiconductor light-emitting device. Examples of the semiconductor light-emitting device include a light-emitting diode (LED), a superluminescent diode (SLD), and a laser diode (LD). The light-emitting device 2 is preferably an ultraviolet-light-emitting device radiating ultraviolet light.

The light source unit 10 further include, for example, a substrate 3, a lead terminal 4, a bonding wire 5, a reflector 6, and a thin film 7. The substrate 3 supports the encapsulating member 1 and the light-emitting device 2. Examples of the material of the substrate 3 include aluminum, silicon, ceramics, silicon carbide (SiC), gallium nitride (GaN), glass, tungsten, molybdenum, and sapphire.

The lead terminal 4 is disposed on the substrate 3. The light-emitting device 2 and the lead terminal 4 are electrically connected by the bonding wire 5. For example, a portion of the lead terminal 4 and the bonding wire 5 are also encapsulated in the encapsulating member 1.

The reflector 6 is a component for reflecting light radiated from the light-emitting device 2 and leading the light forward. The reflector 6 extends from the substrate 3 in a thickness direction of the substrate 3 and surrounds a surface of the substrate 3. The reflector 6 is in contact with a side of the encapsulating member 1, and may keep the shape of the encapsulating member 1.

The thin film 7 is disposed on the encapsulating member 1 and is, for example, in contact with the encapsulating member 1. A side of the thin film 7 is, for example, in contact with the reflector 6. The encapsulating member 1 is, for example, surrounded by the thin film 7 and the reflector 6. The encapsulating member 1 can also be encapsulated with the use of the thin film 7 and the reflector 6. Examples of the material of the thin film 7 include glass and transparent resins such as silicone resins. The light source unit 10 does not necessarily need the thin film 7 because the light-emitting device 2 can be adequately encapsulated with the use of the encapsulating member 1 only. In other words, the light source unit 10 may not include the thin film 7 and a surface of the encapsulating member 1 may be exposed to the outside of the light source unit 10.

Light radiated from the light-emitting device 2 passes through the encapsulating member 1 and exits from the light source unit 10 as exiting light 20. In some cases, a portion of the light radiated from the light-emitting device 2 is reflected as reflected light 30 at an interface between the encapsulating member 1 and the thin film 7.

Next, a method for manufacturing the light source unit 10 will be described. The method for manufacturing the light source unit 10 according to the present embodiment includes, for example: applying the above resin composition to the light-emitting device 2 to cover the light-emitting device 2 with the resin composition; and increasing viscosity of the resin composition to form the encapsulating member 1. The method for applying the resin composition to the light-emitting device 2 is not particularly limited. For example, the resin composition may be applied to the light-emitting device 2 using a dispenser. When the viscosity of the resin composition at room temperature (20° C.±15° C.) is high, the viscosity of the resin composition may be decreased by heating the resin composition before applying the resin composition to the light-emitting device 2. Heating conditions are not particularly limited. The resin composition having been heated may have a temperature of 100° C. to 250° C.

The method for increasing the viscosity of the resin composition is not limited to a particular one. In the case where the resin composition having been heated is applied to the light-emitting device 2, the viscosity of the resin composition may be increased by cooling the resin composition. Cooling conditions are not particularly limited. The cooling decreases the temperature of the resin composition, for example, to room temperature. The cooling may be performed by leaving the resin composition at room temperature. When the resin composition includes the solvent, the viscosity of the resin composition may be increased by removing the solvent from the resin composition, for example, by evaporating the solvent.

EXAMPLES

Hereinafter, the present invention will be described in more detail with reference to Example and Comparative Example. However, the present invention is not limited to Example.

Example 1

First, 22.6 g of perfluoro-2-methylene-4-methyl-1,3-dioxolane (the compound represented by the formula (M2)), 1.12 g of itaconic anhydride, and 50 mL of 1,1,1,2,2,3,4,5,5,5-decafluoropentane (Vertrel XF manufactured by Chemours-Mitsui Fluoroproducts Co., Ltd.) were mixed under an argon atmosphere at room temperature. While the argon atmosphere was being maintained, 0.155 g of perfluorobenzoyl peroxide was added to the resulting mixture and the mixture was stirred and mixed. Next, dissolved oxygen was removed from the mixture by a freeze-pump-thaw technique. The mixture was heated at 40° C. under stirring to perform a reaction for 72 hours. The resulting reaction mixture was added to 300 mL of chloroform. The precipitate generated thereby was collected by filtration. The obtained residue was a copolymer (the polymer (P1)) of perfluoro-2-methylene-4-methyl-1,3-dioxolane and itaconic anhydride. The yield of the copolymer was 19.2 g, and the percentage yield was 81.0%.

Next, the obtained copolymer was dissolved in 1H-perfluorohexane. Methanol was allowed to slowly fall into the resulting solution drop by drop to gradually precipitate polymers. Polymers precipitated just after the start of the precipitation and just before the end of the precipitation were removed to collect the rest of the polymers. An amount of 15 g of a transparent and solid copolymer was obtained by removing the solvent.

Next, a resin composition was produced by adding a solvent to the copolymer. Hexafluorobenzene was used as the solvent. The content of the copolymer was 30 wt % in the resin composition. Next, a high thermal conductive ceramic substrate having a surface with a lead terminal was prepared. A GaN LED (emission wavelength: 365 nm) was disposed on the substrate, and the LED and the lead terminal were connected via a bonding wire. Then, the resin composition was applied to the LED. The solvent was removed from the resin composition to increase the viscosity of the resin composition, and thereby an encapsulating member was produced. A light source unit of Example 1 was produced in this manner.

(Transmittance)

The copolymer obtained in Example 1 was measured for its light transmittance at a wavelength of 365 nm. The light transmittance was measured by the following method. First, 1.0 g of the copolymer was dissolved in 9.0 g of dichloropentafluoropropane (ASAHIKLIN (registered trademark) AK-225 manufactured by AGC Inc.) to produce a measurement solution containing the copolymer at a concentration of 10 weight %. The measurement solution was put in a quartz cell (optical path length: 1.0 cm), and the light transmittance of the measurement solution at 365 nm was measured. To measure the light transmittance, an ultraviolet-visible-near-infrared spectrophotometer UV-1900 (manufactured by Shimadzu Corporation) was used. Next, the light transmittance of ASAHIKLIN (registered trademark) AK-225 at 365 nm was measured in the same manner as for the measurement solution. The light transmittance of the measurement solution was corrected on the basis of the light transmittance of ASAHIKLIN (registered trademark) AK-225. The resulting value was determined as the light transmittance of the copolymer at 365 nm. The light transmittance of the copolymer at a wavelength of 365 nm was 95%.

(1% Weight Loss Temperature)

The copolymer obtained in Example 1 was measured for its 1% weight loss temperature. The term "1% weight loss temperature" refers to a temperature at which the weight of the copolymer becomes lower by 1% than the weight thereof obtained before the measurement, the temperature being obtained by heating the copolymer under an air atmosphere from room temperature at a temperature increase rate of 10° C./min using a thermogravimetric analyzer (TGA). The copolymer had a 1% weight loss temperature of 230° C.

(Encapsulation Performance)

A change of the shape of the encapsulating member of Example 1 was observed for 60 minutes from the formation of the encapsulating member and was evaluated according to the following criteria. The encapsulating member can be considered to have high encapsulation performance when the evaluation result is "○". The encapsulating member can be considered to have insufficient encapsulation performance when the evaluation result is "x". Table 1 shows the results.

○: A change of the shape of the encapsulating member has not been confirmed visually within 60 minutes from the formation of the encapsulating member.

x: A change of the shape of the encapsulating member has been confirmed visually within 60 minutes from the formation of the encapsulating member.

(Change in Illuminance)

A DC current of 17.6 mA was applied to the light-emitting device (LED) of the light source unit of Example 1. The illuminance of light exiting from the light source unit was measured at that moment using an integrating sphere photometer. After that, a DC current of 300 mA was applied to the light-emitting device, and the light-emitting device was kept lit for 1,000 straight hours. Next, a DC current of 17.6 mA was applied to the light-emitting device, and the illuminance of light exiting from the light source unit was measured using an integrating sphere photometer. A ratio between the illuminance of the light exiting from the light source unit after the continuous lighting test and that before the continuous lighting test was calculated, and a change in illuminance was evaluated according to the following criteria. Table 1 shows the results.

○: The ratio of the illuminance after the continuous lighting test to the illuminance (initial illuminance) before the continuous lighting test is 90% or more.

x: The ratio of the illuminance after the continuous lighting test to the initial illuminance is less than 90%.

Comparative Example 1

First, the inside of a stainless steel autoclave equipped with a stirrer and having an inner volume of 500 cc was degassed. Then, 55 g of $CF_2$=$CFOC_3F_7$, 600 g of $CF_2ClCF_2CHClF$ (manufactured by AGC Inc., product name: AK225cb), 1 g of perfluorocyclohexane carbonyl peroxide, and 11 g of tetrafluoroethylene (TFE) were introduced by pressure. While the contents were being stirred, the inner temperature of the autoclave was increased to 50° C. and a reaction was performed for 5 hours.

Next, the autoclave was cooled, and the contents were taken out and moved to a 2-liter glass beaker. While the contents were being stirred, 500 g of methanol was put into the beaker. A polymer was thereby deposited. After removing the supernatant, the polymer was again dissolved in AK225cb. Then, the resulting solution was filtered using a PTFE membrane filter having a pore diameter of 1 μm. The solvent was removed from the resulting solution using an evaporator. An amount of 27 g of a polymer was obtained in this manner.

The resulting polymer was dissolved in 1H-perfluorohexane. Methanol was allowed to slowly fall into the resulting solution drop by drop to gradually precipitate polymers. Polymers precipitated just after the start of the precipitation and just before the end of the precipitation were removed to collect the rest of the polymers. An amount of 15 g of a transparent and highly viscous perfluoro polymer (resin composition) was obtained by removing the solvent.

Next, a high thermal conductive ceramic substrate having a surface with a lead terminal was prepared. A GaN LED (emission wavelength: 365 nm) was disposed on the substrate, and the LED and the lead terminal were connected via a bonding wire. Next, the resin composition heated at 100° C. was applied to an LED. The resin composition was then cooled to room temperature, and thereby an encapsulating member was produced. The encapsulating member was transparent and highly viscous then. A light source unit of Comparative Example 1 was obtained in this manner.

(Viscosity)

The perfluoro polymer obtained in Comparative Example 1 was measured for its viscosity. First, the viscosity of the perfluoro polymer was measured at a temperature of 50° C. to 100° C. using a cone-and-plate rotational viscometer. A graph was created where a temperature-viscosity relation of the perfluoro polymer was plotted. The viscosity of the perfluoro polymer at 25° C. was calculated on the basis of the graph. The perfluoro polymer had a viscosity of 250 Pa s at 25° C.

(Others)

The perfluoro polymer obtained in Comparative Example 1 was measured for its light transmittance at a wavelength of 365 nm and its 1% weight loss temperature in the same manner as in Example 1. Table 1 shows the results. Moreover, the encapsulation performance of the encapsulating member and the change in illuminance were evaluated for the light source unit of Comparative Example 1 in the same manner as in Example 1. Table 1 shows the results. It should be noted that for the light source unit of Comparative Example 1, the change in illuminance was evaluated in a state where a reflector for keeping the shape of the encapsulating member was attached to the substrate.

TABLE 1

| | Viscosity at 25° C. (Pa · s) | Light transmittance at wavelength of 365 nm (%) | 1% weight loss temperature (° C.) | Encapsulation performance | Change in illuminance |
|---|---|---|---|---|---|
| Example 1 | Solid | 95 | 230 | ○ | ○ |
| Comparative Example 1 | 250 | 93 | 215 | x | ○ |

As can be seen from Table 1, the encapsulating member (Example 1) formed from the resin composition including the polymer (P1) has high encapsulation performance. Moreover, the results of the evaluation of the change in illuminance, etc. reveal that this encapsulating member has high heat resistance too.

INDUSTRIAL APPLICABILITY

The resin composition of the present embodiment is suitable for the material of an encapsulating member for encapsulating a light-emitting device.

The invention claimed is:

1. A resin composition for encapsulating a light-emitting device, wherein the resin composition comprises: a polymer (P2) including a structural unit (A) represented by the following formula (1); and a polymer (P3) including a structural unit (B) having at least one functional group selected from the group consisting of a carbonyl-containing group, a hydroxyl group, an epoxy group, an isocyanate group, and a cyano group:

(1)

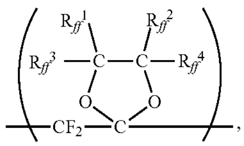, where $R_{ff}^1$ to $R_{ff}^4$ each independently represent a fluorine atom, a perfluoroalkyl group having 1 to 7 carbon atoms, or a perfluoroalkyl ether group having 1 to 7 carbon atoms, and $R_{ff}^1$ and $R_{ff}^2$ are optionally linked to form a ring.

2. The resin composition according to claim 1, wherein the structural unit (B) has at least one functional group selected from the group consisting of an acid anhydride group, an epoxy group, an isocyanate group, and a cyano group.

3. The resin composition according to claim 1, wherein the structural unit (B) has an acid anhydride group.

4. The resin composition according to claim 1, wherein the structural unit (B) has a ring structure.

5. The resin composition according to claim 1, wherein the structural unit (A) is represented by the following formula (2):

(2)

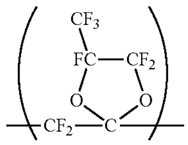.

6. A method for manufacturing a light source unit, comprising:

applying the resin composition according to claim 1 to a light-emitting device to cover the light-emitting device with the resin composition; and increasing viscosity of the resin composition to form an encapsulating member in which the light-emitting device is encapsulated.

7. The manufacturing method according to claim 6, further comprising heating the resin composition before applying the resin composition to the light-emitting device.

8. The manufacturing method according to claim 7, wherein the viscosity of the resin composition is increased by cooling the resin composition.

9. A light source unit, comprising:

a light-emitting device; and an encapsulating member in which the light-emitting device is encapsulated, wherein the encapsulating member includes: a polymer (P2) including a structural unit (A) represented by the following formula (1); and a polymer (P3) including a structural unit (B) having at least one functional group selected from the group consisting of a carbonyl-containing group, a hydroxyl group, an epoxy group, an isocyanate group, and a cyano group:

(1)

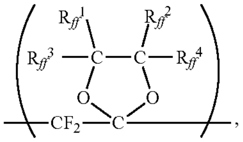

where $R_{ff}^1$ to $R_{ff}^4$ each independently represent a fluorine atom, a perfluoroalkyl group having 1 to 7 carbon atoms, or a perfluoroalkyl ether group having 1 to 7 carbon atoms, and $R_{ff}^1$ and $R_{ff}^2$ are optionally linked to form a ring.

* * * * *